(12) United States Patent
Wanlass

(10) Patent No.: US 6,228,716 B1
(45) Date of Patent: May 8, 2001

(54) METHOD OF MAKING DAMASCENE FLASH MEMORY TRANSISTOR

(76) Inventor: Frank M. Wanlass, 2655 Keystone Ave. Apt. 4, Santa Clara, CA (US) 95051

( * ) Notice: Subject to any disclaimer, the term of this patent is extended or adjusted under 35 U.S.C. 154(b) by 0 days.

(21) Appl. No.: 09/442,896

(22) Filed: Nov. 18, 1999

(51) Int. Cl.$^7$ ................................................ H01L 21/8247
(52) U.S. Cl. .......................... 438/264; 438/594; 438/653
(58) Field of Search .................... 438/257, 264, 438/593, 594, 634, 653, 656

(56) References Cited

U.S. PATENT DOCUMENTS 5,907,781 * 5/1999 Chen et al. ........................... 438/656
6,133,096 * 10/2000 Su et al. ............................... 438/264

* cited by examiner

Primary Examiner—Chandra Chaudhari

(57) ABSTRACT

This invention is a processing method for forming flash memory MOS transistors. The method uses chemical mechanical polishing to self align both a floating gate and an overlying control gate to the MOS channel region in both the width and length directions, thereby improving layout density. The method enables the capacitance between the control gate and the floating gate to be much larger than the capacitance between the floating gate and the channel; this reduces programing voltages. The method does not require any Shallow Trench Isolation (STI), and does not require Local Oxidation of Silicon (LOCOS), thereby resulting in little damage to the silicon.

18 Claims, 9 Drawing Sheets

Figure 1A:
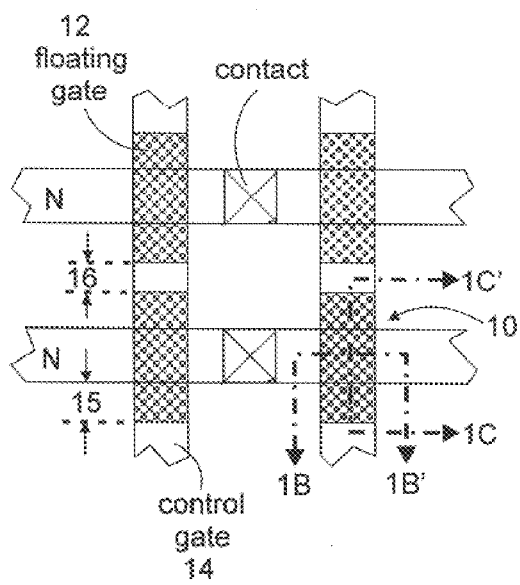
Figure 1B:
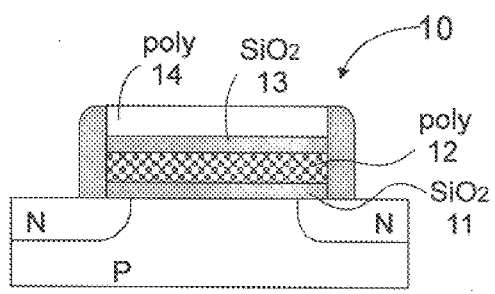
Figure 1C:
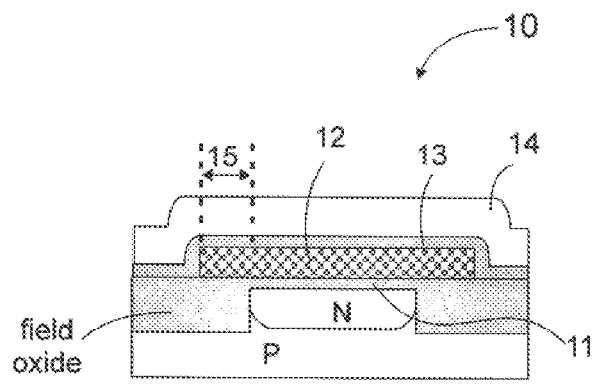
Figure 2B:
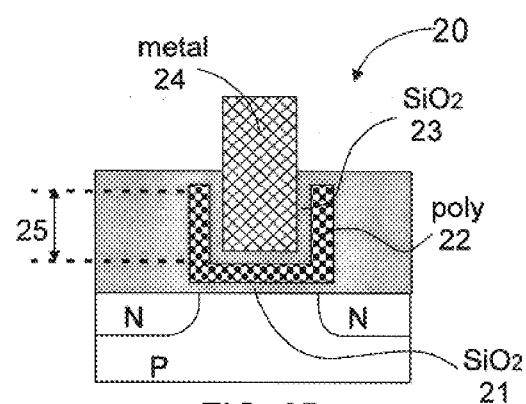
Figure 2A:
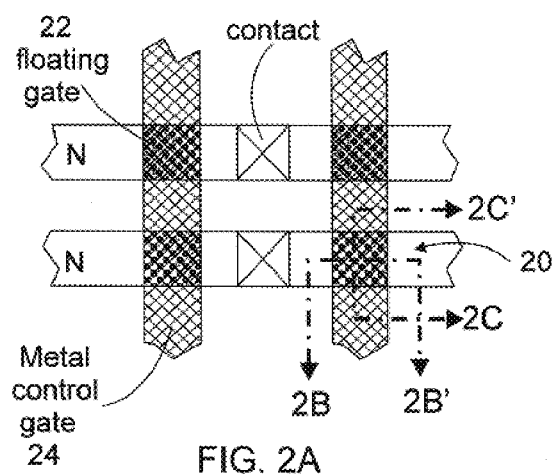
Figure 2C:
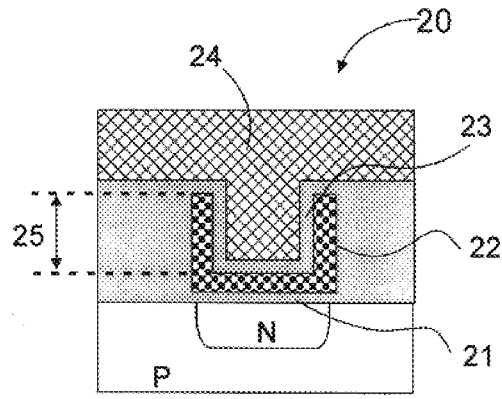
Figure 3A:
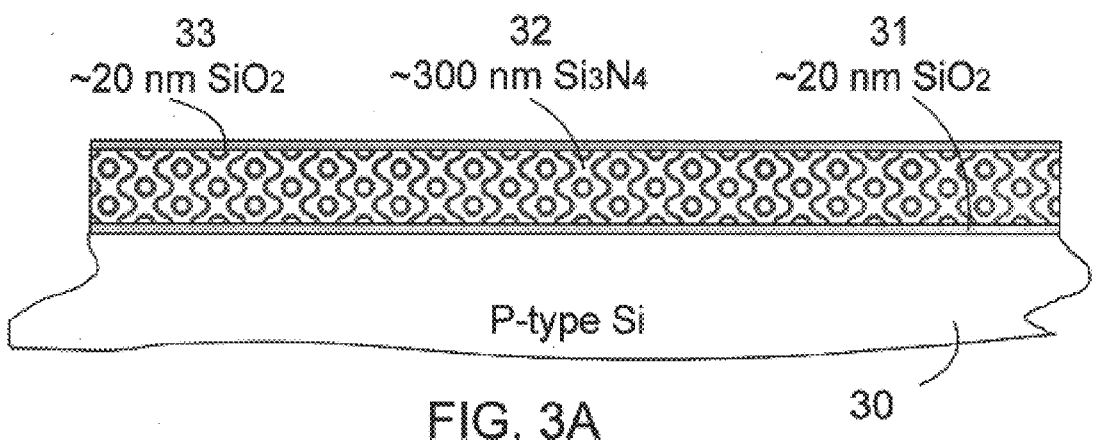
Figure 3B:
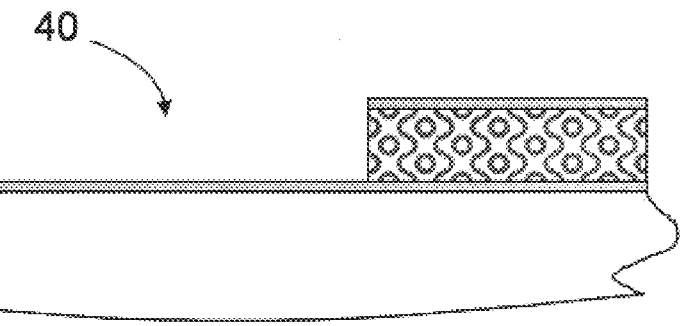
Figure 3C:
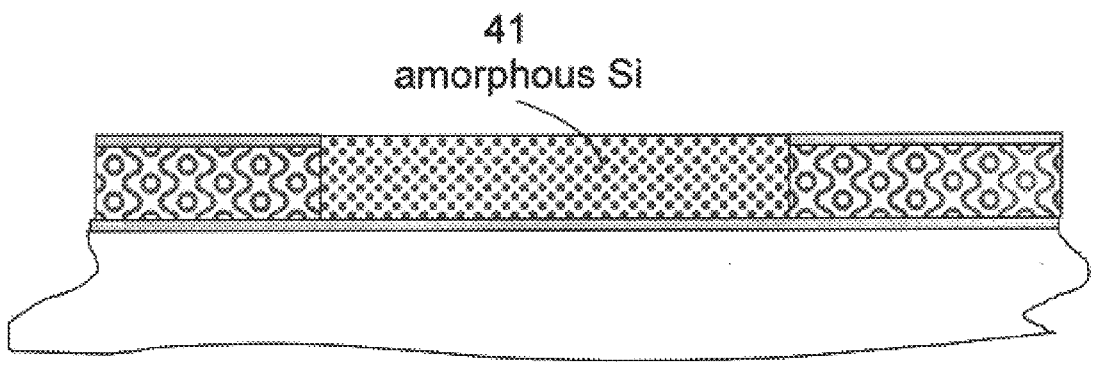

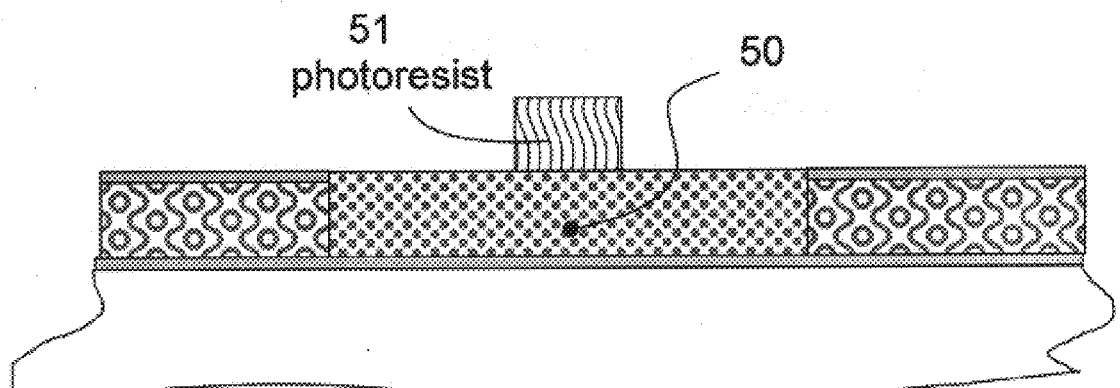
FIG. 4A  Side View
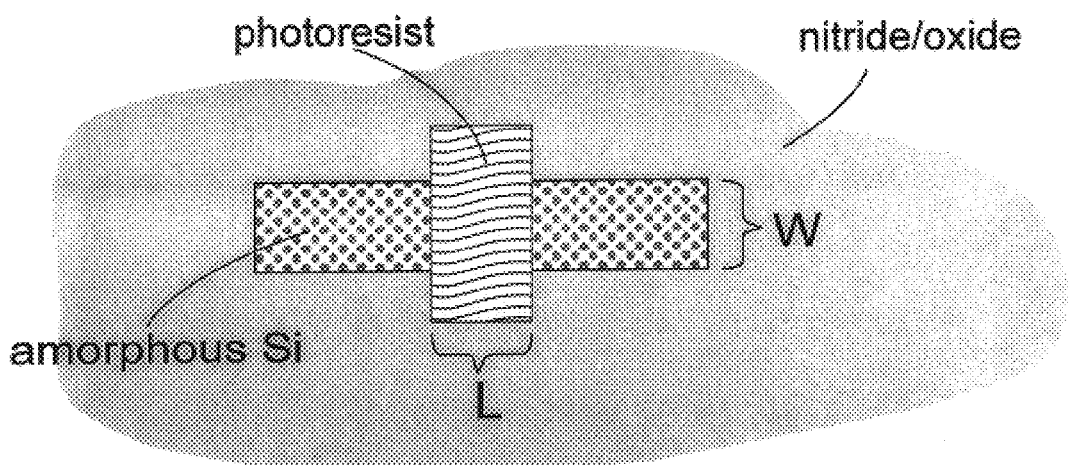
FIG. 4B  Top View

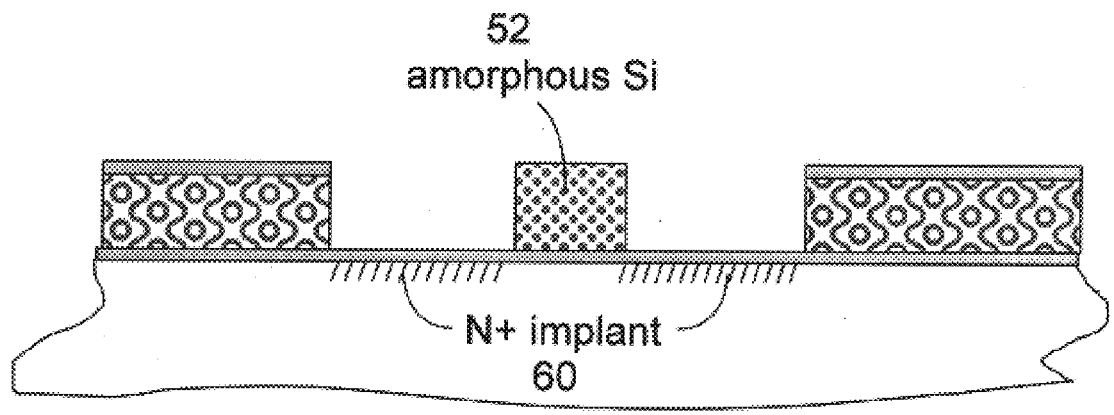
FIG. 5A  Side View
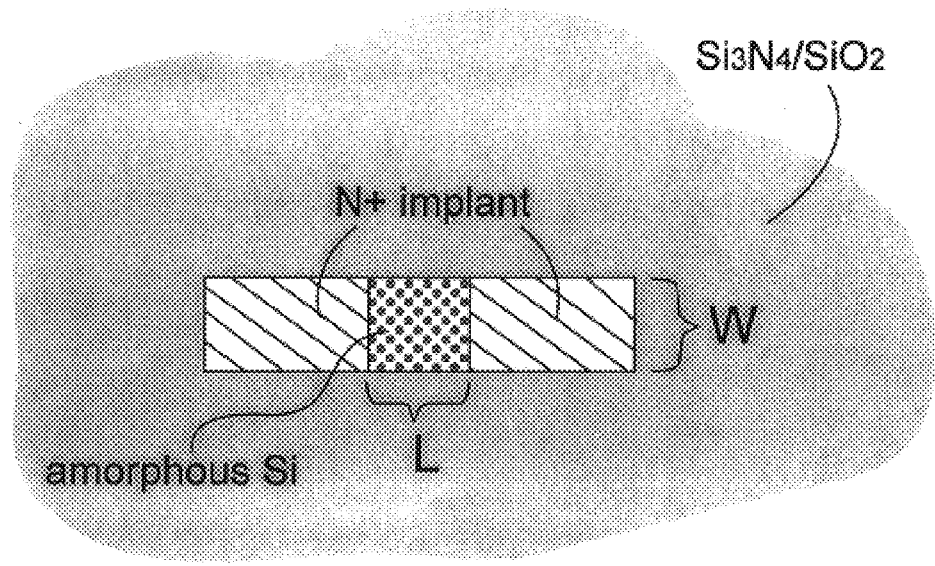
FIG. 5B  Top View

METHOD OF MAKING DAMASCENE FLASH MEMORY TRANSISTOR

FIELD OF THE INVENTION

This invention is a processing method for forming an MOS flash memory transistor wherein both a floating gate and a control gate are self aligned to the transistor channel region in both the width and length directions, and wherein metal interconnection lines make borderless connections to the control gate and to the source and drain diffusions. The method does not require any defect generating heavy oxidation of the silicon.

BACKGROUND OF THE INVENTION

MOS silicon gate technology defines an MOS flash memory transistor location by a field oxide opening, and defines the transistor channel location by a polysilicon floating gate overlying this opening, and a polysilicon control gate overlying and aligned to the floating gate. The width of the floating gate determines the channel length L of the transistor, and the width of the field oxide opening determines the channel width W of the transistor. The floating gate length is made longer than the channel width W to allow for misalignment tolerance. For a flash memory transistor with a sub micron channel width this tolerance can be almost as large as the width W. This problem severely limits the layout density of flash memory arrays. As shown in FIG. 1A, the spacing between transistors in the width direction can be no closer than two overlaps 15 plus the spacing 16 between floating gates 12 in the width direction.

Another important concern when designing a flash memory transistor is the coupling capacitance Ccf between the control gate and the floating gate. It is desirable to make Ccf larger than the tunneling capacitance Cfs between the floating gate and the substrate. As shown in FIG. 1B, Ccf is the capacitance between control gate 14 and floating gate 12 separated by dielectric 13, and Cfs is the capacitance between floating gate 12 and the substrate separated by tunneling dielectric 11. As a result of the overlaps 15, It is apparent that the area of control gate 14 is only somewhat larger than the area of floating gate 12. And, since dielectric 11 needs to be very thin for electron tunneling to occur, it is very difficult to make dielectric 13 much thinner than dielectric 11, resulting in Ccf only being somewhat larger than Cfs.

SUMMARY OF THE INVENTION

The present invention is a method for forming an MOS flash memory transistor wherein its floating gate is self aligned to the transistor channel region in both the width and the length directions. As shown in FIG. 2A, floating gate transistors 20 can be as close in the width direction as the isolation spacing of N diffusions. As shown in FIGS. 2B and 2C, the overlap 25 of the floating gate 22 is in the vertical direction on four sides of the control gate 24. Therefore It is possible to have a large ratio of coupling capacitance Ccf to tunneling capacitance Cfs, limited only by the vertical height 25.

In addition, this invention:

1—Allows the use of a control gate made from metal or other conductors.

2—Creates totally planar surfaces for all masking levels, which facilitates photo masking of very narrow and closely spaced features.

3—Minimizes substrate defects by not using Local Oxidation of Silicon (LOCOS), or Shallow Trench Isolation (STI).

BRIEF DESCRIPTION OF THE DRAWINGS

FIGS. 1A–1C show plane and cross section views of a prior art flash memory transistor.

FIGS. 2A–2C show plane and cross section views of a damascene flash memory transistor.

FIGS. 3A–3C show a cross section of a portion of a P type wafer coated with a thin silicon dioxide layer and a thick silicon nitride layer, shows an opening etched into the silicon nitride layer, and shows the opening filled with filled with amorphous silicon.

FIGS. 4A–4B show the patterning of photo photoresist to define a channel region.

FIGS. 5A–5B show an N+ implantation.

FIGS. 6A–5C show the deposition of silicon dioxide over source and drain, shows the formation of a thin gate dielectric, and shows a deposited layer of polysilicon.

FIGS. 7A–7C show the removal of polysilicon except in the channel region, shows the formation of silicon dioxide over the polysilicon, and shows the deposition of titanium nitride.

FIGS. 8A–8C show the etching of contact openings, the deposition of titanium and titanium nitride, and shows the deposition of tungsten.

FIGS. 9A–9C show the planarizing of the tungsten, and shows the patterning of deposited aluminum for interconnects.

DETAILED DESCRIPTION OF THE INVENTION

The following is a description of one of several preferred process flows for forming NMOS flash memory transistors; the steps for forming PMOS transistors are not described, but would be the same except for the interchange of P implants with N implants.

1. FIG. 3A shows, at the start of the process, a portion of a P type silicon wafer 30 coated first with a thin layer 31 of silicon dioxide (oxide) ~20 nm thick, coated with a layer 32 of silicon nitride (nitride) ~300 nm thick, and finally coated with a layer 33 of oxide ~20 nm thick.

2. Photoresist is patterned and oxide layer 33 and nitride layer 32 are anisotropically plasma etched, stopping at the thin oxide layer 31, resulting in an opening 40, as shown in FIG. 3B after photoresist removal. This plasma can be formed in a $Cl_2/O_2$ gas mixture as disclosed in U.S. Pat. No. 4,832,787 to J. A. Bondur. The opening 40 will determine the position of a subsequent flash transistor, and is representative of many such openings in a flash memory array.

3. Amorphous silicon 41 is deposited to a thickness greater than the depth of opening 40.

4. Chemical mechanical polishing is performed on the amorphous silicon 41 using layer 33 as a polish stop, resulting in the top surface of the amorphous silicon 41 remaining in opening 40 being substantially coplanar with the top surface of layer 33, as shown in FIG. 3C. This polishing can be accomplished with a polishing pad using a slurry containing KOH and very small silica or alumina particles.

5. Photoresist 51 is applied and patterned to define the transistor channel region 50, with the width of the photoresist 51 defining the subsequent NMOS channel length L, and the width of amorphous silicon 41 defining the channel width W, as shown in FIGS. 4A and 4B.

6. With the photoresist 51 in place, the amorphous silicon 41 is anisotropically plasma etched, stopping at the underlying thin oxide 31, and leaving amorphous silicon 52 in the channel region 50. This could be a bromine or chlorine based plasma that etches nitride or oxide much more slowly than silicon. With the photoresist still in place a high dose N+ implant 60, of phosphorus or arsenic, is performed with the photoresist 51 and amorphous silicon 52 protecting the portion of underlying silicon that will be a subsequent channel region. The implant energy should be very low because only the thin oxide 31 has to be penetrated. FIGS. 5A and 5B shows the results of this after photoresist removal.

Figure 6A:
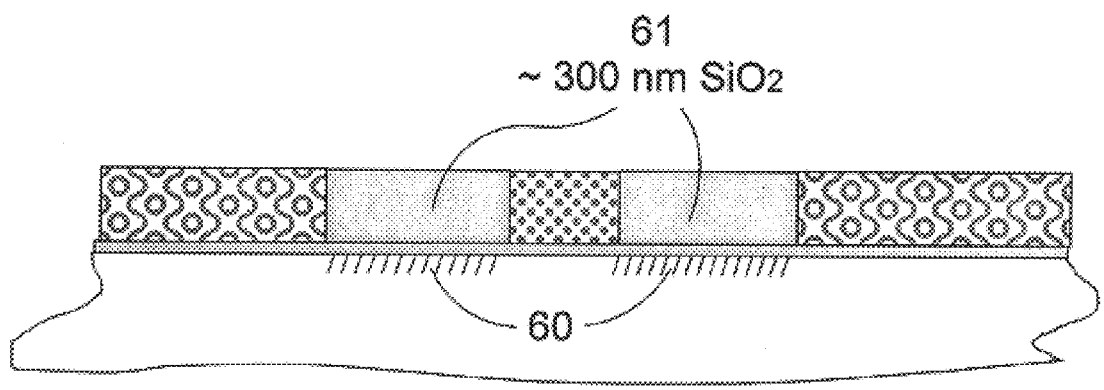
Figure 6B:
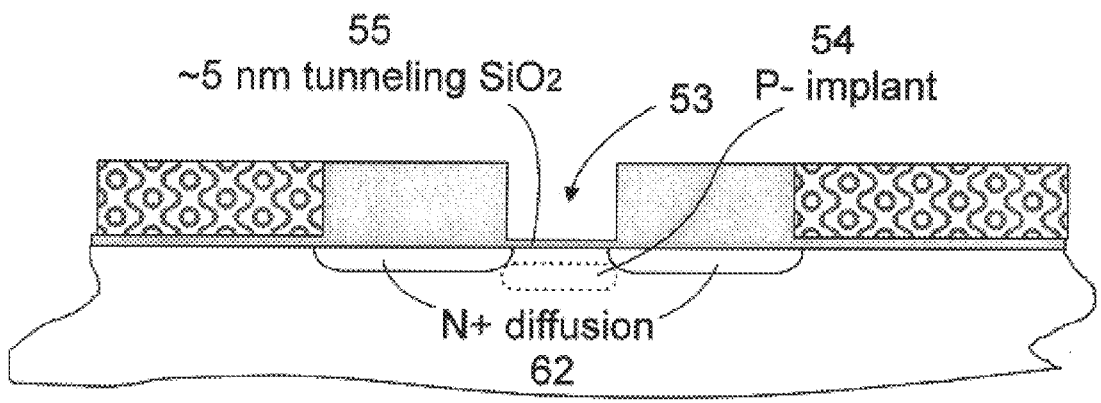

7. Oxide is deposited to a thickness greater than the amorphous silicon 52 thickness. This oxide can be deposited from tetraethylorthosilicate gas in a mixture with ozone at a temperature of approximately 400° C. Chemical mechanical polishing is performed on this oxide, using layer 32 as a polish stop, and leaving oxide regions 61 overlying the implanted dopant 60, as shown in FIG. 6A. Again this polishing can be accomplished with a polishing pad using a slurry containing KOH and very small alumina or silica particles. The remaining amorphous silicon is removed using a chemical or a plasma etch, where this etch does not significantly etch oxide or nitride, resulting in opening 53 as shown in FIG. 6B.

8. As shown in FIG. 6B, a light dose of boron 54 is implanted and diffused into the silicon at the bottom of opening 53 for punch through control, a thin tunneling gate oxide 55 is formed at the bottom of opening 53, and the implant 60 is diffused to form junctions 62.

Figure 6C:
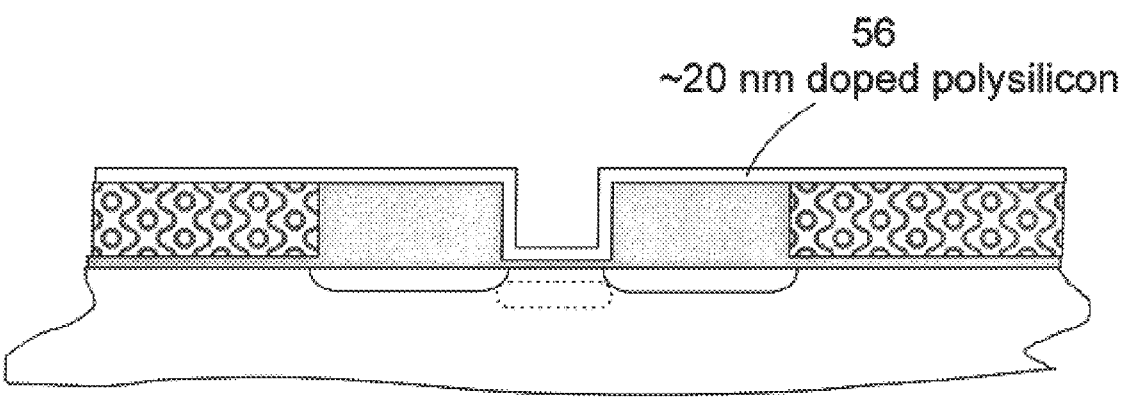
Figure 7A:
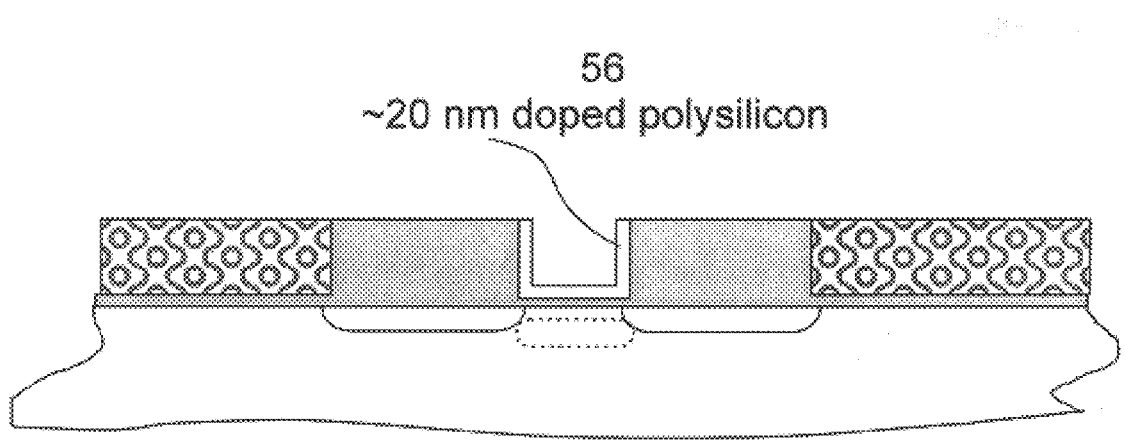
Figure 7B:
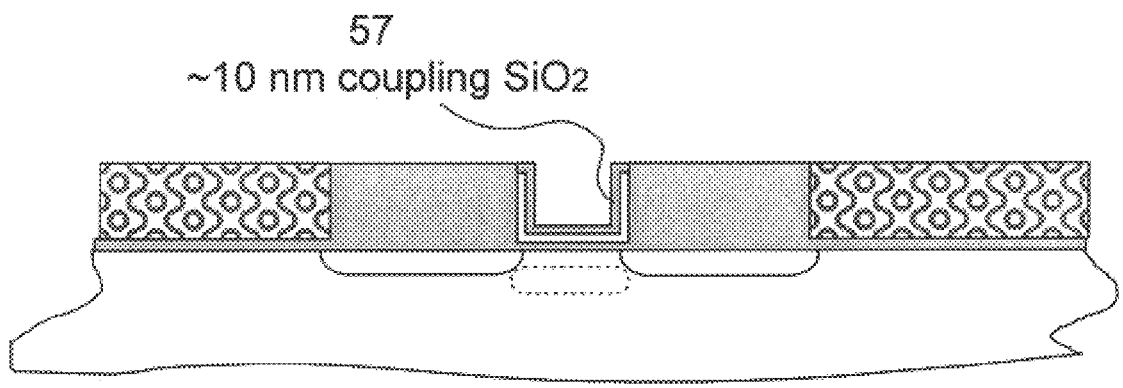
Figure 7C:
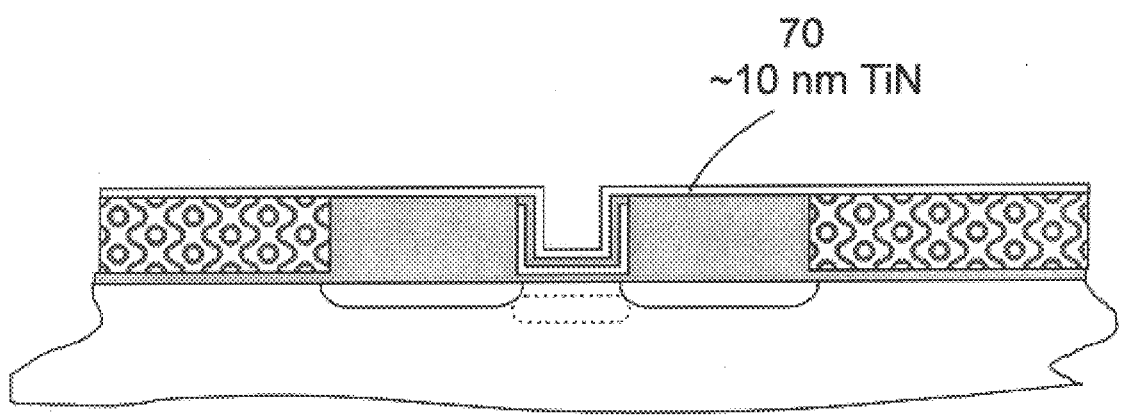

9. A layer 56 of doped polysilicon ~20 nm is deposited as shown in FIG. 6C. This polysilicon is removed by chemical mechanical polishing except for the polysilicon 56 remaining in opening 53 as shown in FIG. 7A. A thin oxide 57 is formed on the polysilicon 56, and a thin layer of titanium nitride 70 is deposited as shown in FIGS. 7B and 7C.

Figure 8A:
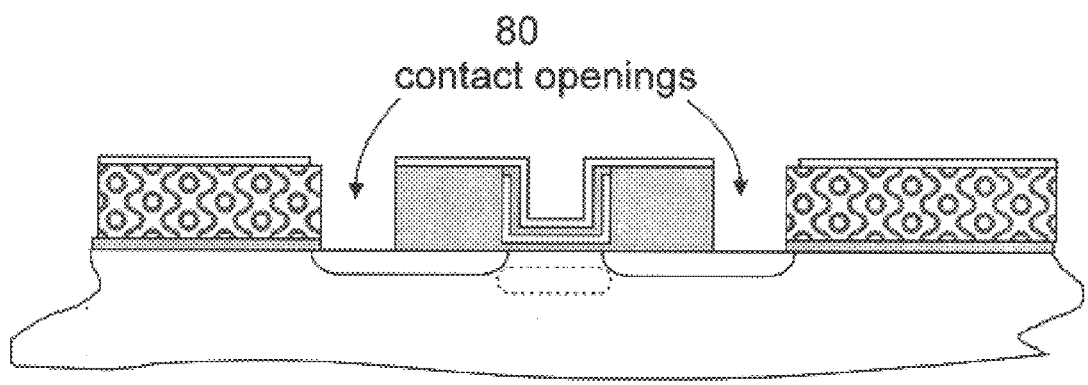

10. Contact openings 80 are masked and etched through the TiN and anisotropically plasma etched through the ~300 nm field oxide 61 to the N+ diffusions 62, using a fluorine based plasma etch chemistry that etches oxide, and does not significantly etch nitride. Even if this contact etch is misaligned and is over a junction edge the junction will not be exposed, because the junction edges are diffused slightly sideways, beneath the nitride layer 32, as shown in FIG. 8A.

Figure 8B:
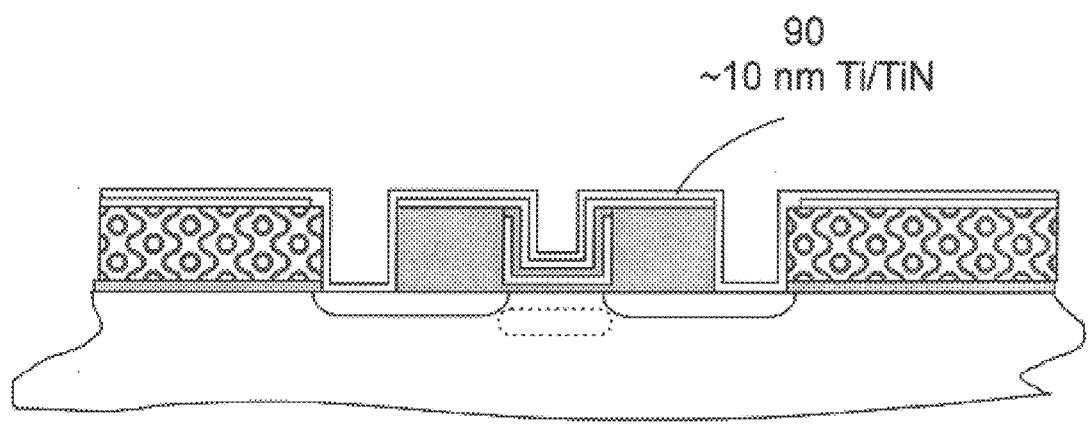
Figure 8C:
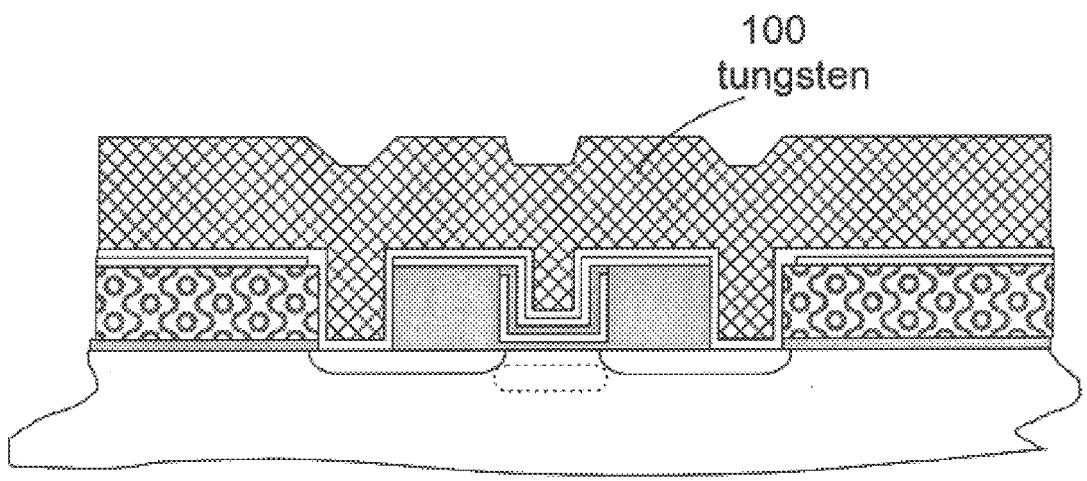

11. A thin double layer 90 of first titanium (Ti) and then TiN is deposited. The Ti assures an ohmic contact to the N+ diffusions, as shown in FIG. 8B. A layer of tungsten 100 is deposited to a thickness greater than 300 nm, as shown in FIG. 8C.

Figure 9A:
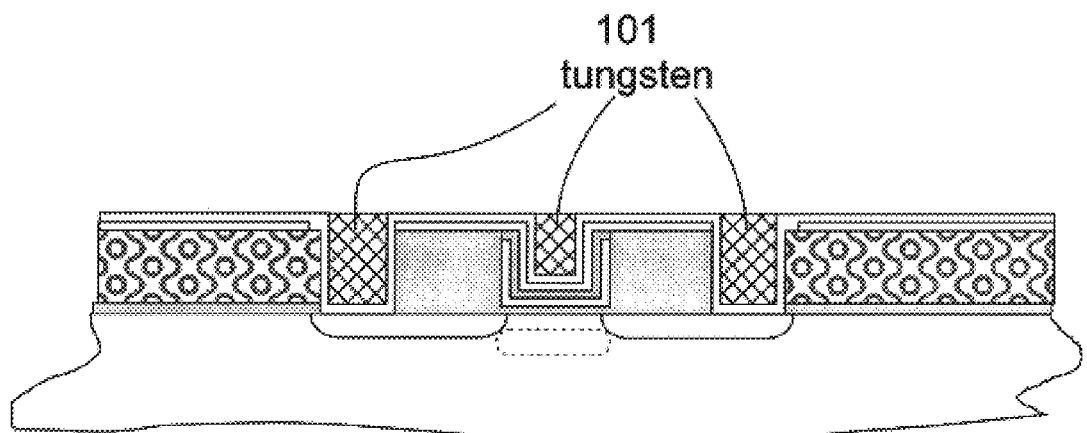

12. The tungsten is chemically mechanically polished using layer 90 as a polish stop, ending with a tungsten surface 101 coplanar to layer 90, as shown in FIG. 9A. This polish could be performed as described in U.S. Pat. No. 5,516,346 to K. C. Cadien.

Figure 9B:
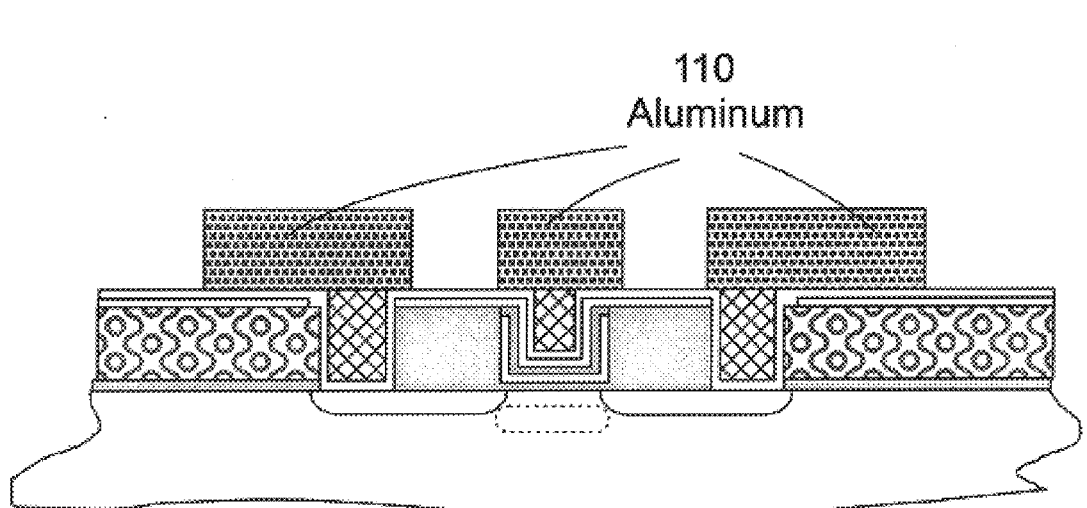
Figure 9C:
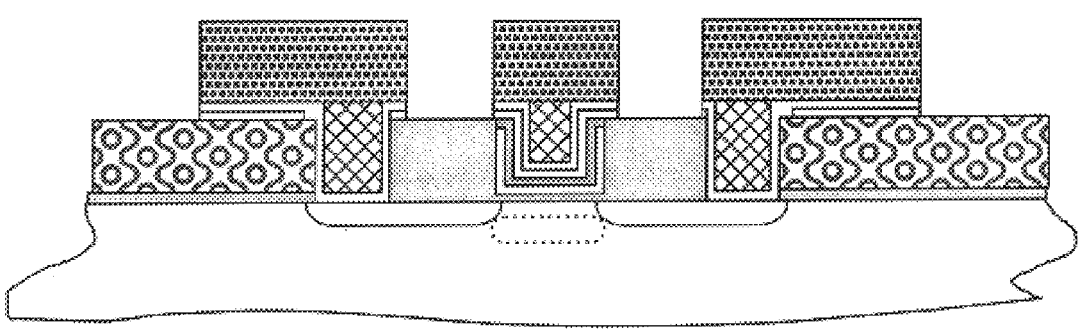

13. Aluminum 110 is deposited, photo masked, and patterned to form interconnects, as shown in FIG. 9B. With the photoresist still in place, the underlying thin layers of TiN, Ti, TiN are etched, as shown in FIG. 9C after photoresist removal.

I claim:

1. A method of making a flash memory MOS transistor comprising:
    providing a substrate;
    forming a first dielectric layer over said substrate;
    etching one or more openings in said first dielectric layer, wherein said openings define the locations of flash memory MOS transistors;
    depositing a material layer over said substrate to fill said openings;
    patterning said material layer to define source and drain regions adjacent to a remaining portion of said material layer;
    doping said source and drain regions with dopants;
    depositing a second dielectric layer over said source and drain regions;
    removing said remaining portion of said material layer to define channel regions in said substrate, wherein said channel regions are disposed between said source and drain regions;
    forming a tunneling dielectric layer over said channel regions;
    depositing a first conductive layer over said tunneling dielectric layer;
    everywhere removing said first conductive layer except over said channel regions;
    forming a third dielectric layer over said first conductive layer;
    etching contact openings over said source and drain regions;
    forming contacts over said third dielectric layer in said channel region, and in said contact openings.

2. The method of claim 1, wherein said first dielectric layer includes an etch stop layer; and wherein said material layer is patterned by anisotropic etching stopping before etching through said etch stop layer.

3. The method of claim 1, wherein said step of depositing said material layer further includes polishing said material layer so that said material layer remains in only said openings and wherein said material layer is substantially coplanar with said first dielectric layer.

4. The method of claim 1, wherein said first dielectric layer has a characteristic etch rate different than that of said material layer and different than that of said second dielectric layer.

5. The method of claim 1, wherein said second dielectric layer over said source and drain region is polished to be substantially coplanar with said first dielectric layer.

6. The method of claims 3 or 5, wherein said polishing is chemical mechanical polishing.

7. The method of claim 1, wherein forming said contacts further includes the steps of:
    depositing a second conductive layer over said substrate before the step of etching contact openings over said source and drain regions;
    and after etching said contact openings, depositing a third conductive layer over said second conductive layer and into said contact openings, wherein said third conductive layer forms electrical contact with said source and drain regions and wherein third conductive layer acts as a barrier layer against any subsequent conducting materials diffusing into said substrate.

8. The method of claim 7, wherein additionally a fourth conductive material is deposited filing said contact openings and filling said channel region openings; and
    wherein a fifth conductive layer is deposited and patterned to make electrical contact with said fourth conductive material in said contact openings and in said channel region openings.

9. The method of claim 1, further includes doping said channel region to control punch through, threshold voltage and field inversion.

10. The method of claim 1, wherein the step of doping said source and drain region includes controlling junction profiles to minimize hot carrier effects.

11. The method of claim 2, wherein said first dielectric layer is a silicon nitride, and wherein said etch stop layer is a silicon oxide.

12. The method of claim 1, wherein said material layer is amorphous silicon or polycrystalline silicon.

13. The method of claim 1, wherein said tunneling dielectric layer is a silicon oxide.

14. The method of claim 1, wherein said first conductive layer is amorphous silicon or polycrystalline silicon.

15. The method of claim 7, wherein said second conductive layer is TiN, and wherein said third conductive layer is a multilayer comprising a first layer of Ti and a second layer of TiN.

16. The method of claim 8, wherein said fourth conductive material is tungsten, and wherein said fifth conductive material is aluminum.

17. The method of claim 8, wherein said fourth conductive material is planarized by chemical-mechanical polishing, leaving said fourth conductive material only in said contact openings and in said channel region openings, and substantially coplanar with said first dielectric layer.

18. The method of claim 1, wherein said third dielectric layer is a dielectric multilayer of two or more layers.

* * * * *